(12) United States Patent
Mark et al.

(10) Patent No.: US 8,120,503 B2
(45) Date of Patent: Feb. 21, 2012

(54) BRUSH WEAR MONITOR HAVING MOUNTED FLAGS INTERACTABLE WITH AN IMPEDANCE DEPENDENT SWITCH

(75) Inventors: Bernhard Mark, Waldshut (DE); Max Hobelsberger, Wuerenlingen (CH)

(73) Assignee: Alstom Technology Ltd, Baden (CH)

(*) Notice: Subject to any disclaimer, the term of this patent is extended or adjusted under 35 U.S.C. 154(b) by 412 days.

(21) Appl. No.: 12/429,627

(22) Filed: Apr. 24, 2009

(65) Prior Publication Data

US 2009/0267782 A1    Oct. 29, 2009

(30) Foreign Application Priority Data

Apr. 25, 2008   (EP) .................................. 08155159

(51) Int. Cl.
G08B 21/00   (2006.01)
(52) U.S. Cl. ......... 340/648; 340/635; 310/242; 310/245
(58) Field of Classification Search .................. 340/540, 340/635, 648; 310/238–247
See application file for complete search history.

(56) References Cited

U.S. PATENT DOCUMENTS

| | | | |
|---|---|---|---|
| 2,193,172 A | 3/1940 | Hills | |
| 4,272,695 A | 6/1981 | Buchwald et al. | |
| 4,348,608 A | 9/1982 | Michael | |
| 4,451,786 A | 5/1984 | Sawada et al. | |
| 4,488,078 A | 12/1984 | Orton | |
| 5,285,035 A | 2/1994 | Williams et al. | |

FOREIGN PATENT DOCUMENTS

| | | |
|---|---|---|
| CA | 1194112 | 9/1985 |
| DE | 560 232 C | 9/1932 |
| DE | 30 31 915 A1 | 4/1982 |
| DE | 3417711 | 11/1985 |
| DE | 86 00 934 U1 | 4/1986 |
| DE | 8600934 | 4/1986 |
| DE | 195 21 702 A1 | 2/1996 |
| DE | 196 19 733 A1 | 11/1997 |
| DE | 19758235 | 4/1999 |
| DE | 102 57 621 A1 | 7/2004 |
| EP | 0 360 197 A | 3/1990 |
| EP | 1801938 | 6/2007 |
| GB | 1215649 | 12/1970 |
| GB | 1 488 837 A | 10/1977 |
| GB | 1564384 | 4/1980 |
| GB | 2300311 | 10/1996 |
| JP | 6141513 | 5/1994 |

(Continued)

OTHER PUBLICATIONS

European Search Report for EP 08155159 mailed Dec. 30, 2008.

(Continued)

*Primary Examiner* — Jeffery Hofsass
(74) *Attorney, Agent, or Firm* — Leydig, Voit & Mayer, Ltd.

(57) ABSTRACT

A worn brush monitoring system for monitoring a plurality of brushes of an electrical machine comprises a plurality of mounted flags configured to be in moveable communication relative to a wear of each of the plurality of brushes and an electrical recording circuit. The electrical recording circuit includes at least one impedance device configured to provide impedance data, at least one switch having a contact plate interactable with at least two of the plurality of mounted flags at different points along a length of the contact plate and an impedance dependent on the length of the contact plate, and a recording device configured to detect changes in electrical characteristics in the electrical recording circuit resulting from changes in a switch state, the switch state defined by the interaction between the mounted flags and the electrical recording circuit, as a result of brush wear.

10 Claims, 1 Drawing Sheet

FOREIGN PATENT DOCUMENTS

| | | |
|---|---|---|
| JP | 07274445 | 10/1995 |
| SU | 1 403 169 A1 | 6/1988 |

OTHER PUBLICATIONS

Co-pending U.S. Appl. No. 12/439,664, filed Apr. 24, 2009, entitled "Switch for a brush wear recording circuit".

Co-pending U.S. Appl. No. 12/429,764, filed Apr. 24, 2009, entitled "Switch for a brush wear recording circuit".

Search report from EP 2 112 519 A3 published on Nov. 4, 2009.

Co-pending U.S. Appl. No. 12/429,664, filed Apr. 24, 2009, entitled "Switch for a brush wear recording circuit".

BRUSH WEAR MONITOR HAVING MOUNTED FLAGS INTERACTABLE WITH AN IMPEDANCE DEPENDENT SWITCH

Priority is claimed to European Patent Application No. EP 08155159.0, filed on Apr. 25, 2008, the entire disclosure of which is incorporated by reference herein.

The invention relates to brushes used for transferring current in electrical machines such as electric motors or alternators, and more specifically to brushes designed to preferentially wear. More particularly the invention relates to a monitoring system for identifying critical brush wear.

BACKGROUND

Brush gear mechanisms are used extensively in certain motors, generators and other rotating electrical machinery to conduct current between stationary and rotating parts (commutators or slip rings). To avoid or at best minimise the wear of the rotating parts, which are typically constructed of copper or brass, brushes are made of soft materials, such as carbon and graphite, so as to preferentially wear. It is important that brush wear is monitored to ensure that the brushes do not wear beyond a minimum level as a completely worn brush can lead to electrical arcing resulting in machine part failure.

One established practice of monitoring brush wear is to install brush assemblies in brush houses with visual inspection means to enable operator inspection. Due to human factors however machine failures still occur. For other reasons, including cost reduction it maybe desirable to at least supplement such monitoring with automated monitoring. As a result instrumented brush-monitoring systems have been developed.

Monitoring of the excitation voltage supplied a brush is one known method of monitoring brush wear. For example GB1564384 describes a process of monitoring the signature of the excitation voltage for unusual high-energy noise spikes created by brush arcing. It does this by using sensors connected to each brush and employing comparative algorithms and filtering means to analysis the data. U.S. Pat. No. 4,451,786 and CA 1194112 also teach of similar methods with similar disadvantages including that a fault condition i.e. arcing but not brush wear, is monitored and so the method is reactive rather than preventative. Further disadvantages include the fact that monitoring involves complex signature filtering and interpretation and so is open to error. The methods also inherently lack the ability to utilize one sensor to monitor multiple brushes.

JP6141513 discloses another brush monitoring method that utilizes brush electrical signatures relying only on inputs of armature current and an armature revolution count to calculate brush wear. As the method does not directly measure or detect brush wear the accuracy of the method is limited and yet despite analyses simplicity still requires a sensor per monitored brush.

GB 1 215 649 A discloses a further brush monitoring system having a feeler portion, supported in a frame mounted on a brush holder, resiliently urged onto the brush. When the outer end of the brush passes beyond a predetermined portion, due to brush wear, the feeler portion actuates a switch in a monitoring circuit for that brush.

Larger machines typically have 30 or more brushes and therefore to improve inherent monitoring reliability and simplify maintenance and installation it is advantageous for these systems to have as few sensors as possible. The requirement for the cited references teaches to have a sensor per monitored brush therefore disadvantages all the above teachings.

DE 3417711 A1 provides another brush wear monitoring system capable of monitoring the wear of multiple brushes. The switching arrangement of the system is mounted on each brush holder and comprises a swivelled lever that is biased onto the brush. The lever further comprises a contact that when the brush wears, moves towards a brush holder, holding the brush, by the swivel motion of the level. When the brush wears to a certain point the contact contacts the brush holder. This has the effect of closing the brush wear recording circuit so by enabling the triggering of an brush wear alarm.

DE 86 00 934 U1 provides another brush wear monitoring system capable of monitoring the wear of multiple brushes by using a swivel arm that swivels with the wear movement of the brush so as to close a switch at a brush wear point.

DE 197 58 235 A1 provides another brush wear monitoring system comprising of a rod mounted on a brush. The system uses the principle of a sensor detecting a source mounted on the rod as the rod is moved by brush wear. The source may be a magnetised ring while the sensor may be either a magnetic-hydraulic sensor or an optical-hydraulic sensor.

SUMMARY OF THE INVENTION

It is an aspect of the invention to provide an improved means and apparatus for triggering a worn brush alarm for an electrical machine.

The invention is based on the general idea of utilising the wear movement of a brush to switch a recording circuit. Accordingly, one aspect provides a worn brush monitoring system for an electrical machine. The system comprising a plurality of brushes that have a mounted flag in wear movable communication with the brush and an electrical recording circuit. The circuit comprising at least one impedance device (e.g. a resistor) for providing impedance characteristics to the circuit, and switches, having a state defined by the interaction between the flags and the circuit wherein brush wear causes the interaction. The switching of the circuit remote from the blush, enabled by the flag being mounted on the brush, minimising the fouling potential of the circuit as well as enabling the system to be retrofitted to existing installations without modification or replacement of the brush or brush housing. Finally a recording device detects changes in electrical characteristics of the circuit resulting from changes to the switch state thereby providing the means of triggering a worn brush alarm. The switch comprises a contact plate interactable with more than one of the flags, along different points along its length and has an impedance dependant on its length. The interaction with flags contacting the contact plate along different points results in the contact plate imparting different impedances to the circuit wherein the difference can be used by the single recording device to identify which of a series of monitored brushes is worn.

In another aspect the contact plate has an insulating layer pierceable by the flags such that piercing results in the contact between the flag and the contact plate. In an aspect the insulating layer is pierceable by a piercing element of the flag. In a further aspect the piercing element is a sharpened point.

A yet further aspect includes a reading device for querying the recording device, including by wireless communication. An example of such a wireless communication system is RFID technology that provides cost effective remote communication means.

The system of the various aspects can be powered by various means including an energy-harvesting module, for powering the recording device, that harnesses electrical energy or AC (voltage or current) supplied to or from the brushes.

In another aspect of the invention the electrical characteristic is the high frequency component of the brush potential wherein recording of the electrical characteristic is enabled by the system further comprising capacitive grounding to earth of the harvesting module so as to provide a reference point for measuring the high frequency component. In this way the high frequency component of the brush potential, where in this specification "high frequency" is defined as greater or equal to 10 Hz, can be used to monitor brush wear without the need for complex filtering or interpretation.

A further or alternate aspect of the invention is to overcome or at least ameliorate the disadvantages and shortcomings of the prior art or provide a useful alternative.

Other objectives and advantages of the present invention will become apparent from the following description, taken in connection with the accompanying drawings wherein by way of illustration and example, an embodiment of the invention is disclosed.

BRIEF DESCRIPTION OF THE DRAWINGS

By way of example, an embodiment of the invention is described more fully hereinafter with reference to the accompanying drawing, in which.

DETAILED DESCRIPTION

Figure 1:
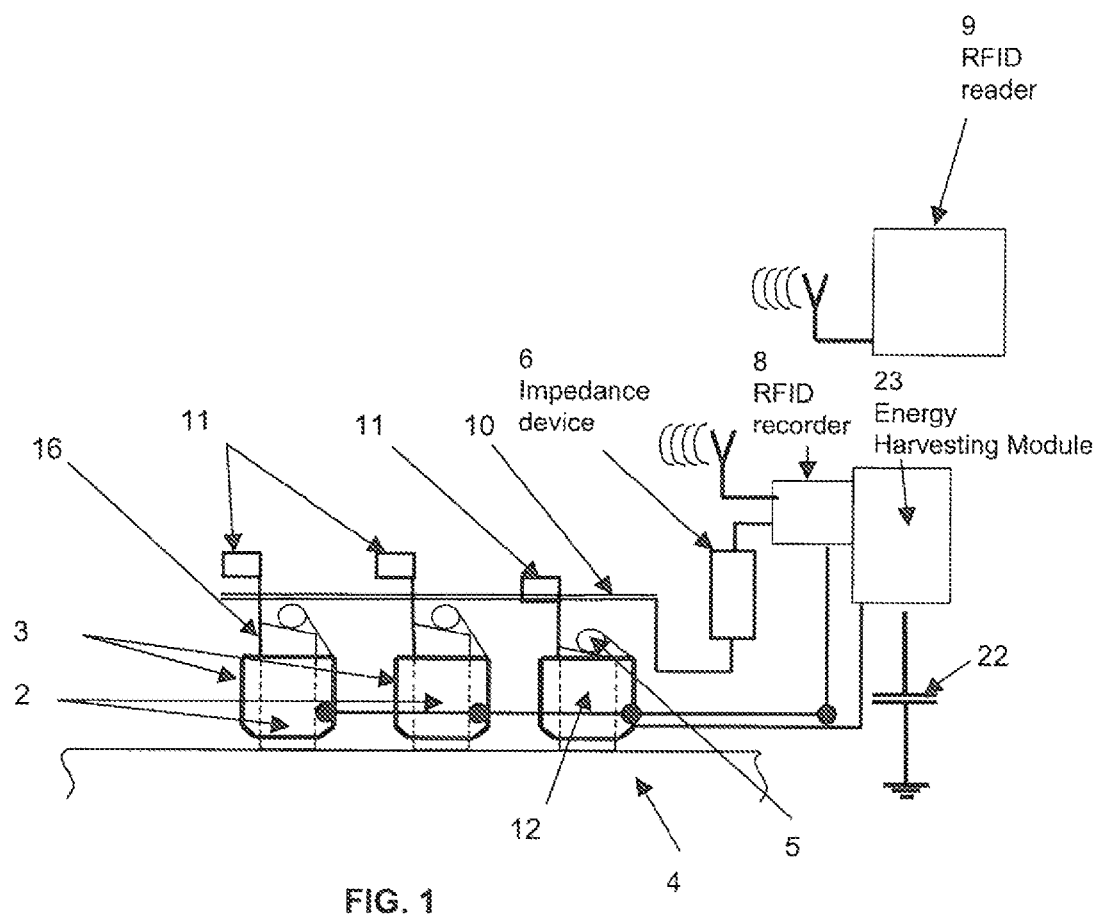
FIG. 1 is a schematic diagram of an embodiment of the invention having a contact plate.

Preferred embodiments of the present invention are now described with reference to the drawings, wherein like reference numerals are used to refer to like elements throughout. In the following description, for purposes of explanation, numerous specific details are set forth in order to provide a thorough understanding of the invention. It may be evident, however, that the invention may be practiced without these specific details.

FIG. 1 shows a brush monitoring systems comprising brush flags 1, mounted on brushes 2 interacting with a recording circuit so as to identify when a brush 12 is worn wherein the recording circuit comprises switches, an impedance device 6 and a recorder device 8.

Brush flags 11 are mounted preferably on the hooks 16 of brushes 2 and extend out from the brush 2 so as to form part of the switch of the recording circuit where interaction between the flag 11 and the circuit changes the state of the switch. In this way flags 11 and how they interact with the circuit defines the switch state while the mounting of the flags 11 is the means of ensuring that flags 11 move with the wear movement of the brush 2. In this way a direct link between brush-wear and changes to the circuit is created.

The form of the flag 11 depends on the form of the switch, which, in an exemplary embodiment as shown in FIG. 1, is a contact plate 10.

In a preferred embodiment, as shown in FIG. 1, flags 11 provide a means of electrical communication between a plurality of brushes 2 and a recording device 8 where in a preferred embodiment the communication establishes a current flow via an impedance device 6. A contact plate 10, normally isolated from the brushes 2, provides the means by which a flag 11 of a worn brush 12 communicates with a recorder 8 in a recording circuit. The contact plate 10 is resistive having an impedance characteristic depend on length. In this way the characteristic voltage or current presented to the recording device 8 varies depending on where along the length of the contact plate 10 brush flags 2 make contact with the contact plate 10. In an embodiment, the contact plate 10 is covered with insulation that is pierceable by brush flags 11, for example, by the flag 11 having a piercing element in the form of a sharpened point. In order for the insulation to be pierceable, insulation is made preferably from deformable material with prefabricated slots. Brush wear movement forces the sharpened point to penetrate the slot by pushing aside deformable side wall material of the slots. This enables flags 11 to contact the contact plate 10 while preventing contamination of contact plate 10 with conductive fouling material.

The embodiment preferably further includes an in series "test voltage source." The test voltage source causes current to flow when the contact plate 10 is electrically connected to the brush 2 and brush holder 3 as a flag 11 contacts the contact plate 10.

Preferably the recorder 8 is a read write RFID (radio frequency identification device) device although it could be any known device capable of recording any change in the electrical characteristic of the recording circuit. Preferably the recorder 8 further communicates with a wireless reading device 9, such as a RFID reader, capable of triggering an alarm. Alternatively the recorder 8 may directly trigger a wear alarm.

An energy harvesting module 23 may be optionally used to supply power to the recording circuit or device as shown in FIG. 1. The harvesting module 23, for harvesting the energy of preferably the current flow to or from the brushes 2, utilises the high frequency component of the current flow. In a capacitive harvesting method the high frequency component of the voltage between the brushes 2 and, for example ground or another slipring, generates power preferably by a transformer. Ground to earth 22 provides a reference point so by enabling use of the high frequency component of brush potential as a trigger for brush wear.

In another embodiment harvesting is by an inductive method whereby the inductive method utilises the high-frequency content of the excitation current flowing to and through the brush 2 to generate power.

Although the invention has been herein shown and described in what is conceived to be the most practical and preferred embodiment, it is recognized that departures can be made within the scope of the invention, which is not to be limited to details described herein but is to be accorded the full scope of the appended claims so as to embrace any and all equivalent devices and apparatus.

REFERENCE NUMBERS

Numbers Used in the Figures
  2 Brush
  3 Brush holder
  4 Slip ring or commutator
  5 Brush spring
  6 Impedance device series
  8 RFID type recording device
  9 RFID reader
  10 Contact Plate
  11 Flag
  12 Worn brush
  16 Flag hook
  22 High voltage capacitor to ground
  23 Energy harvesting module

What is claimed is:

1. A worn brush monitoring system for monitoring a plurality of brushes of an electrical machine comprising:
   a plurality of mounted flags configured to be in moveable communication relative to a wear of each of the plurality of brushes; and an electrical recording circuit including:
  at least one impedance device configured to provide impedance data;
  a recording device configured to detect changes in electrical characteristics in the electrical recording circuit resulting from changes in a switch state, the switch state defined by the interaction between the mounted flags and the electrical recording circuit, as a result of brush wear; and
  at least one switch having a contact plate interactable with at least two of the plurality of mounted flags at different points along a length of the contact plate and an impedance dependent on the length of the contact plate, wherein an interaction with the contact plate at the different points causes the contact plate to impart different impedances to the impedance device, wherein the recording device uses a difference between the different impedances to identify at least one of the plurality of brushes as being worn.

2. The system as recited in claim 1, wherein the contact plate includes an insulating layer pierceable by the mounted flag so as to cause contact between the mounted flag and the contact plate.

3. The system as recited in claim 2, wherein each of the plurality of mounted flags includes a piercing element configured to pierce the insulating layer.

4. The system as recited in claim 3, wherein the piercing element includes a sharpened point.

5. The system as recited in claim 1, further comprising a reading device configured to query the recording device.

6. The system as recited in claim 5, wherein the recording device and the reading device are in wireless communication with each other.

7. The system as recited in claim 6, wherein the recording device includes a RFID device and the read includes a RFID reader.

8. The system as recited in claim 5, wherein the recording circuit includes an energy harvesting module configured to power the recording device by harnessing electrical energy supplied to or from the brushes.

9. The system as recited in claim 8, wherein the harvesting module is configured to harvest using a capacitor.

10. The system as recited in claim 8, wherein the harvesting module is configured to harvest using an inductive device.

* * * * *